(12) United States Patent
Okada et al.

(10) Patent No.: US 6,886,942 B2
(45) Date of Patent: May 3, 2005

(54) PROJECTOR WITH LIGHT SOURCE HAVING VARIABLE BRIGHTNESS BASED ON DETECTED TEMPERATURE INFORMATION

(75) Inventors: Takayuki Okada, Minato-ku (JP); Atsushi Matsudaira, Minato-ku (JP)

(73) Assignee: NEC ViewTechnology, Ltd., Tokyo (JP)

( * ) Notice: Subject to any disclaimer, the term of this patent is extended or adjusted under 35 U.S.C. 154(b) by 307 days.

(21) Appl. No.: 10/197,601

(22) Filed: Jul. 18, 2002

(65) Prior Publication Data

US 2003/0020884 A1 Jan. 30, 2003

(30) Foreign Application Priority Data

Jul. 26, 2001 (JP) .......................................... 2001-225783

(51) Int. Cl.[7] .............................................. G03B 21/18
(52) U.S. Cl. ........................................ 353/52; 353/57
(58) Field of Search ...................................... 353/52, 57

(56) References Cited

U.S. PATENT DOCUMENTS

| | | | | |
|---|---|---|---|---|
| 4,283,658 A | * | 8/1981 | Parker | 315/117 |
| 4,829,327 A | * | 5/1989 | Grunwald | 353/122 |
| 5,136,397 A | * | 8/1992 | Miyashita | 348/748 |
| RE36,060 E | * | 1/1999 | Miyashita | 348/748 |
| 6,111,630 A | * | 8/2000 | Watanuki et al. | 349/161 |
| 6,322,218 B1 | * | 11/2001 | Sugawara et al. | 353/52 |
| 6,419,364 B2 | * | 7/2002 | Takizawa et al. | 353/52 |
| 6,472,828 B1 | * | 10/2002 | Pruett et al. | 315/225 |
| 6,481,854 B1 | * | 11/2002 | Sugawara et al. | 353/52 |

FOREIGN PATENT DOCUMENTS

| | | |
|---|---|---|
| JP | 03-092633 | 9/1991 |
| JP | 7-154725 A | 6/1995 |
| JP | 9-152575 A | 6/1997 |
| JP | 11-109504 A | 4/1999 |
| JP | 2000-194072 A | 7/2000 |
| JP | 2003-015224 | 12/2000 |
| JP | 2001-021999 | 1/2001 |
| JP | 2000-352708 | 1/2003 |

* cited by examiner

Primary Examiner—Russell Adams
Assistant Examiner—Michael Dalakis
(74) Attorney, Agent, or Firm—Sughrue Mion, PLLC

(57) ABSTRACT

A projector changes stepwise electric energy supplied to a light source based on temperature information which is detected by a temperature sensor. The temperature sensor detects the temperature of components of an optical engine or an ambient air temperature. A lamp output control circuit changes stepwise the electric energy supplied to the light source based on the temperature information detected by the temperature sensor.

8 Claims, 5 Drawing Sheets

PROJECTOR WITH LIGHT SOURCE HAVING VARIABLE BRIGHTNESS BASED ON DETECTED TEMPERATURE INFORMATION

BACKGROUND OF THE INVENTION

1. Field of the Invention

The present invention relates to a cooling structure for a projector and a method of controlling such a cooling structure.

2. Description of the Related Art

Heretofore, projectors have been cooled by a fan which is operated under a fixed drive voltage of 12 V, for example. However, because of growing demands for low-noise environments, it is general practice to employ a variable-speed fan for cooling projectors, and lower the rotational speed of the variable-speed fan when the ambient temperature around the projector drops below an allowable temperature for various components of the projector. The variable-speed fan is associated with a sensor for detecting the ambient temperature, and the rotational speed of the variable-speed fan is changed depending on the detected ambient temperature.

According to another speed control scheme, rather than the variable-speed fan changing the rotational speed thereof, the projector itself changes the rotational speed of the variable-speed fan. Specifically, a temperature sensor is installed in the projector itself, and a drive voltage for the fan is established based on a temperature detected by the temperature sensor to control the rotational speed of the fan.

Both the above conventional arrangements change the rotational speed of the fan for thereby cooling the components of the projector and reducing noise produced by the fan.

However, there is a certain limitation on the voltages that can be applied to fans. For example, a general DC fan is used in a voltage range from 7 V to 13 V, and the range of rotational speeds at which the fan can rotate depends on that voltage range. Therefore, an upper limit for ambient temperatures for the installation of a projector should be selected such that the temperatures of the components of the projector will not exceed an allowable level when the fan rotates at a maximum rotational speed. If the upper limit for ambient temperatures for the installation of a projector is to be increased, then the projector should incorporate a fan of higher cooling capability, i.e., a fan having a larger diameter or a fan capable of rotating at a higher rotational speed. However, such a fan of higher cooling capability presents a major obstacle to efforts to reduce the size and noise of the projector.

SUMMARY OF THE INVENTION

It is therefore an object of the present invention to provide a cooling structure for a projector, which is arranged to make the projector small in size, low in noise, and reliable in operation, and a method of controlling such a cooling structure.

To achieve the above object, there is provided in accordance with the present invention a projector comprising a light source for emitting light based on electric energy supplied thereto, an optical engine for generating an image with an electronic device energizable based on a video signal and optical means, a projection lens for enlarging and projecting the image generated by the light source onto a screen, an electric circuit for energizing the electronic device based on a video signal input thereto, a power supply for supplying electric energy to the electric circuit and the light source, a cooling fan for cooling the optical engine, temperature detecting means for detecting a temperature of components of the optical engine and an ambient air temperature, and light source electric energy changing means for changing stepwise electric energy supplied to the light source based on temperature information detected by the temperature detecting means.

The projector may also have fan voltage changing means for controlling a voltage applied to the cooling fan based on temperature information detected by the temperature detecting means, and the light source electric energy changing means may change stepwise electric energy supplied to the light source if the voltage applied to the cooling fan is determined as having reached an upper limit.

With the above arrangement, since the temperature detecting means directly detects the temperature of a component of the optical engine or an ambient air temperature, a margin up to the allowable temperature of the electronic device in the optical engine can be known. If the margin is small, then the light source electric energy changing means reduces the electric energy supplied to the light source, and if the margin is large, then the light source electric energy changing means increases the electric energy supplied to the light source. This control process makes it possible to realize a small-size, low-noise projector because it is not necessary to employ a high-speed or large-diameter cooling fan in view of the temperature of the environment where the projector is installed.

When the electric energy supplied to the light source based on the detected temperature information, the light source electric energy changing means does not instantaneously change the electric energy, but changes the electric energy stepwise over a period of time. Consequently, the projected image is prevented from suffering an abrupt brightness change, but changes its brightness in a manner gentle to the eyes of the observer.

Japanese laid-open patent publication No. 09-152575 discloses an overheating prevention device for reducing electric energy supplied to a light source based on output signals from malfunction detecting circuits that are disposed in both a cooling device and the light source. According to the present invention, the electric energy supplied to the light source is reduced when an increase in the ambient air temperature cannot be cooled by the cooling fan. While the cooling structure incorporated in the projector according to the present invention may operate as an overheating prevention device in this respect, the cooling structure differs from the overheating prevention device disclosed in the above publication in that it serves as a cooling device for increasing the electric energy supplied to the light source again to recover the brightness of the projected image when the ambient air temperature is lowered.

The projector according to the present invention may further comprise means for displaying, in the projected image, a comment or a visual pattern representing a change in the electric energy supplied to the light source or brightness changes of the projected image, when the light source electric energy changing means has changed the electric energy supplied to the light source based on the temperature information detected by the temperature detecting means.

If a change in the electric energy supplied to the light source or a change in the brightness of the projected image is displayed in the projected image, then the observer of the image can be aware of the fact that the brightness is adjusted. The observer can thus know that the temperature of the environment where the projector is installed is high, and that environment is not suitable for the installation of the projector, and at the same time know that the brightness of the projected image is automatically changed by the projector.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1:
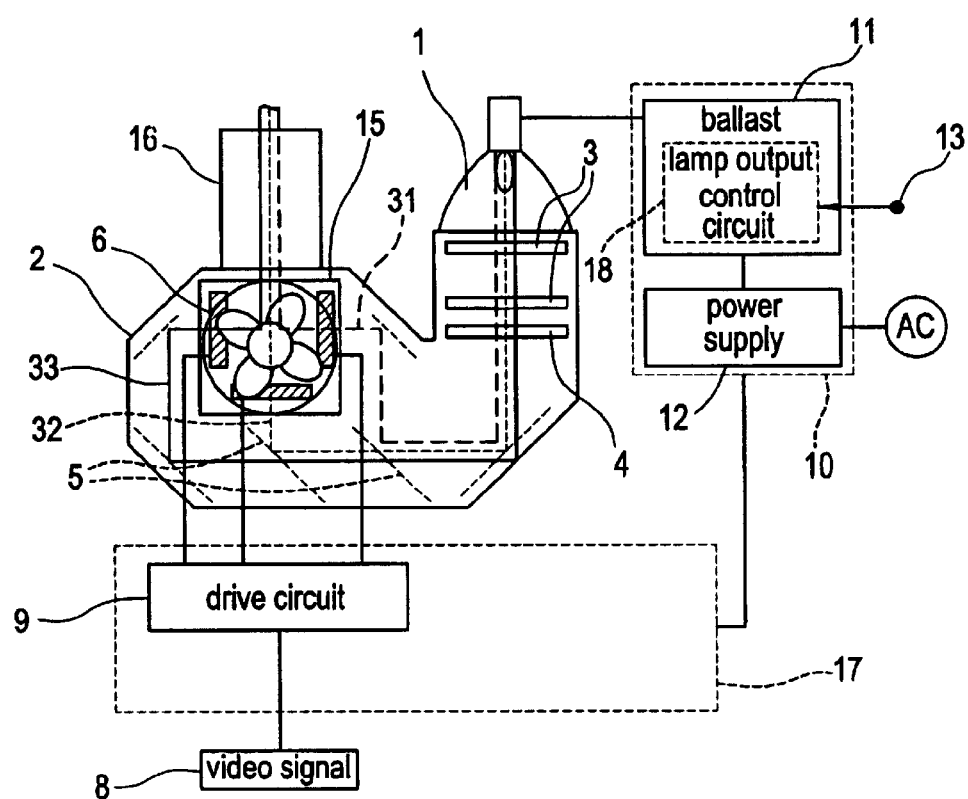
FIG. 1 is a view, partly in block form, of a three-panel liquid crystal projector according to a first embodiment of the present invention.
Figure 2:
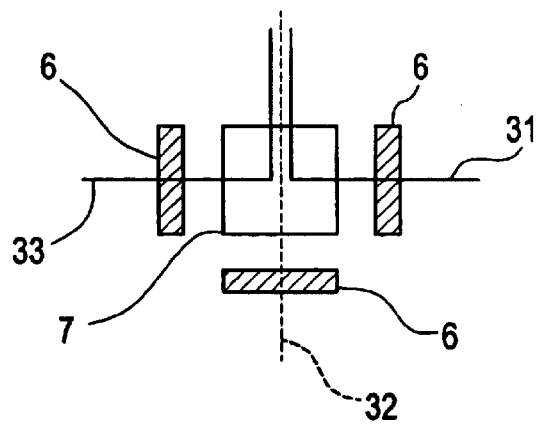
FIG. 2 is an enlarged view of a liquid crystal panel assembly of the three-panel liquid crystal projector shown in FIG. 1.

FIG. 1 shows, partly in block form, a three-panel liquid crystal projector according to a first embodiment of the present invention, and FIG. 2 shows, at an enlarged scale, a liquid crystal panel assembly of the three-panel liquid crystal projector sown in FIG. 1.

As shown in FIG. 1, the three-panel liquid crystal projector according to the first embodiment comprises ultrahigh-pressure mercury lamp 1 serving as a light source for emitting light based on supplied electric energy, optical engine 2, projection lens 16, electric circuit 17, power supply 10 for supplying electric energy to electric circuit 17 and ultrahigh-pressure mercury lamp 1, cooling fan 15 for cooling components of optical engine 2, and temperature sensor 13 serving as a temperature detecting means for detecting the temperature of ambient air.

Optical engine 2 generates an image with an optical means and liquid crystal panels 6 based on the light emitted from ultrahigh-pressure mercury lamp 1. The optical means in optical engine 2 comprises optical integrators 3, polarization converting optical system 4, dichroic mirrors 5, and cross-dichroic prism 7 (see FIG. 2).

Projection lens 16 enlarges an image generated by optical engine 2 and projects the enlarged image onto a screen. Electric circuit 17 has drive circuit 9 for driving liquid crystal panels 6 based on a video signal 8 which is input thereto.

Power supply 10 has a ballast 11 for stabilizing the electric energy supplied to ultrahigh-pressure mercury lamp 1. Ballast 11 has lamp output control circuit 18 which serves as a light source electric energy changing means for changing the electric energy supplied to ultrahigh-pressure mercury lamp 1 based on temperature information detected by temperature sensor 13.

Operation of the three-panel liquid crystal projector according to the first embodiment will be described in detail below.

Electric energy supplied from an external source to power supply 12 is delivered to ballast 11 for energizing ultrahigh-pressure mercury lamp 1 to emit light and also to electric circuit 17. The light emitted from ultrahigh-pressure mercury lamp 1 travels into optical engine 2, is uniformized by optical integrators 3, and has its polarized directions aligned by polarization converting optical system 4. The light is then separated by dichroic mirrors 5 into three primaries, i.e., a red light (R), a green light (G), and a blue light (B). These lights are then sent along a light path (red) 31, a light path (green) 32, and a light path (blue) 33, respectively, to liquid crystal panels 6 (see FIG. 2) which correspond to the respective lights. Liquid crystal panels 6 generate respective images depending on the respective lights with signals from drive circuit 9 which is supplied with video signal 8. The images generated by liquid crystal panels 6 are combined by cross-dichroic prism 7 into a color image, which is then projected onto the screen by projection lens 16.

While in the above process, the components of optical engine 2 have their temperatures raised by absorbing light and heating themselves, and should be cooled. Of the components of optical engine 2, liquid crystal panels 6 (particularly the liquid crystal panel corresponding to the blue light) need to be cooled with particular importance, and are cooled by cooling fan 15 which is positioned above liquid crystal panels 6. Temperature sensor 13, which is installed in a casing, sends detected temperature information to lamp output control circuit 18 in ballast 11, and lamp output control circuit 18 changes the electric energy supplied to ultrahigh-pressure mercury lamp 1 based on the supplied temperature information. At this time, lamp output control circuit 18 does not instantaneously change the electric energy in a manner to switch between ON and OFF states, but changes the electric energy stepwise within a certain period of time. Specifically, if lamp output control circuit 18 judges that the ambient air temperature is higher than a given value T, then lamp output control circuit 18 gradually lowers the electric energy supplied to ultrahigh-pressure mercury lamp 1. Conversely, if lamp output control circuit 18 judges that the ambient air temperature is lower than the given value T, then lamp output control circuit 18 gradually increases the electric energy supplied to ultrahigh-pressure mercury lamp 1. The temperature of liquid crystal panels 6 is thus brought into an allowable thus brought into an allowable temperature range according to the above feedback control process.

By predetermining the relationship between the temperature detected by temperature sensor 13 and the allowable temperature of liquid crystal panels 6 and the relationship between the temperature detected by temperature sensor 13 and the ambient temperature (air temperature), lamp output control circuit 18 can change the electric energy supplied to ultrahigh-pressure mercury lamp 1 with more accurate timing.

Specifically, a margin up to the allowable temperature can be known based on the difference between the temperature detected by temperature sensor 13 and the allowable temperature of liquid crystal panels 6. If the margin is small, then lamp output control circuit 18 reduces the electric energy supplied to ultrahigh-pressure mercury lamp 1, and if the margin is large, then lamp output control circuit 18 increases the electric energy supplied to ultrahigh-pressure mercury lamp 1.

In the present embodiment, therefore, when cooling fan 15 fails to lower the temperature of liquid crystal panels 6 to a point equal to or lower than the allowable temperature, lamp output control circuit 18 reduces the electric energy supplied to ultrahigh-pressure mercury lamp 1, and when the temperature of liquid crystal panels 6 drops to a point equal to or lower than the allowable temperature, lamp output control circuit 18 increases the electric energy supplied to ultrahigh-pressure mercury lamp 1. According to this control process, since the rotational speed of cooling fan 15 does not change to a higher rotational speed for the purpose of cooling the components of optical engine 2, the projector produces low noise.

With the projector according to the present embodiment, as described above, temperature sensor 13 directly detects the temperature of the components of optical engine 2 or the ambient air temperature, thus recognizing a margin up to the allowable temperature of liquid crystal panels 6. If the margin is small, then lamp output control circuit 18 reduces the electric energy supplied to ultrahigh-pressure mercury lamp 1, and if the margin is large, then lamp output control circuit 18 increases the electric energy supplied to ultrahigh-pressure mercury lamp 1. This control process makes it possible to realize a small-size, low-noise projector because it is not necessary to employ a high-speed or large-diameter cooling fan in view of the temperature of the environment where the projector is installed.

When the electric energy supplied to ultrahigh-pressure mercury lamp 1 is changed based on the temperature information detected by temperature sensor 13, it is not instantaneously changed, but gradually changed stepwise over a period of time, so that the projected image is prevented from suffering an abrupt brightness change, but changes its brightness in a manner gentle to the eyes of the observer.

2nd Embodiment

Figure 3:
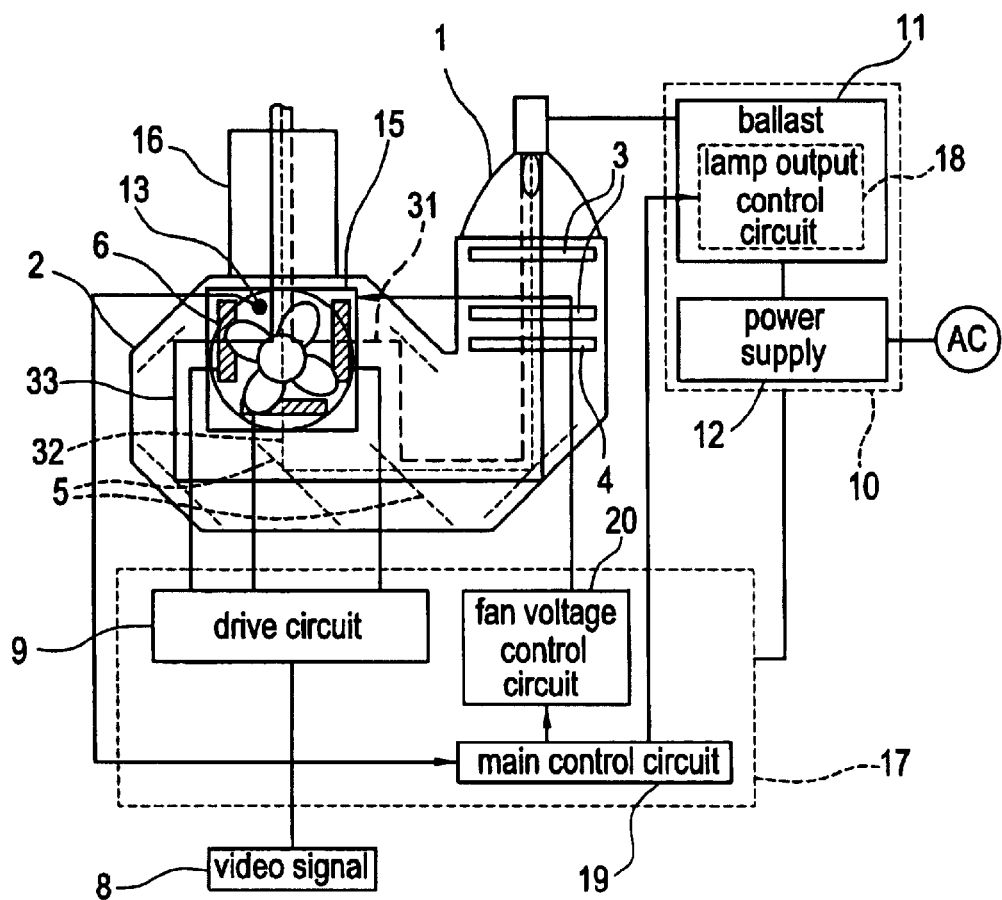
FIG. 3 is a view, partly in block form, of a three-panel liquid crystal projector according to a second embodiment of the present invention.
Figure 4:
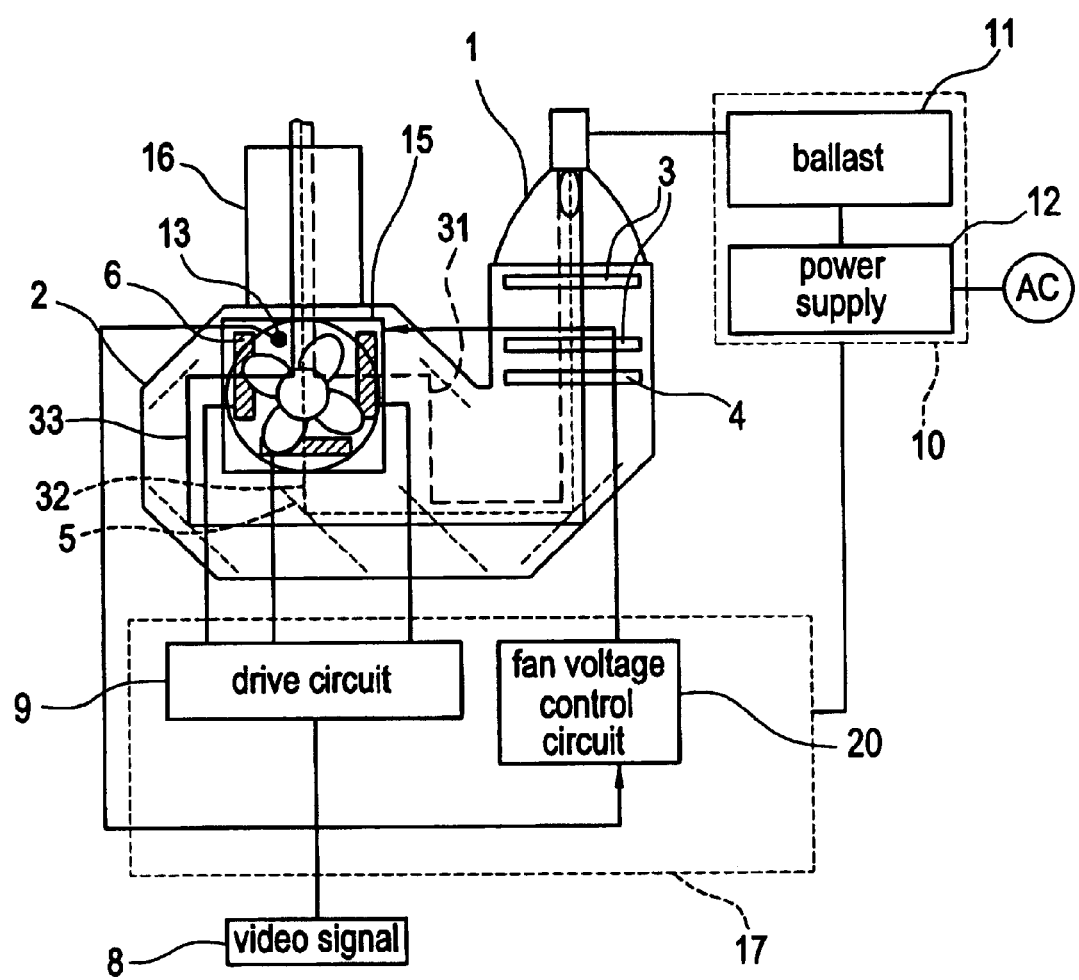
FIG. 4 is a view, partly in block form, of a conventional three-panel liquid crystal projector combined with a fan whose rotational speed can be changed depending on the ambient temperature of an environment where the projector is installed.

FIG. 3 shows, partly in block form, a three-panel liquid crystal projector according to a second embodiment of the present invention. In the first embodiment described above, the principles of the present invention are applied to a conventional projector having a cooling fan whose rotational speed is constant. According to the second embodiment, a function to change the electric energy supplied to ultrahigh-pressure mercury lamp 1 is added to another conventional projector having a cooling fan whose rotational speed is changed depending on the temperature of the environment where the projector is installed. As shown in FIG. 3, details of the optical paths extending from ultrahigh-pressure mercury lamp 1 to projection lens 16 and details of power supply 10 of the three-panel liquid crystal projector according to the second embodiment are identical to those of the three-panel liquid crystal projector according to the first embodiment. Therefore, only those parts of the three-panel liquid crystal projector according to the second embodiment which are different from the three-panel liquid crystal projector according to the first embodiment will be described below.

In the second embodiment, temperature sensor 13 is positioned near liquid crystal panels 6. Preferably, temperature sensor 13 should be positioned in the vicinity of optical components which are most affected by the temperature, i.e., the liquid crystal panel corresponding to the blue light. Electric circuit 17 includes fan voltage control circuit 20 for changing the voltage applied to cooling fan 15, and main control circuit 19 for controlling fan voltage control circuit 20 and lamp output control circuit 18 in power supply 10 based on the temperature information from temperature sensor 13.

The temperature information detected by temperature sensor 13 is sent to main control circuit 19 in electric circuit 7. If main control circuit 19 judges that the voltage applied to cooling fan 15 can be increased, then main control circuit 19 controls fan voltage control circuit 20 to increase the voltage applied to cooling fan 15. The rotational speed of cooling fan 15 is now increased to lower the temperature of liquid crystal panels 6. If main control circuit 19 judges that the voltage presently applied to cooling fan 15 has reached an upper limit, then main control circuit 19 controls lamp output control circuit 18 in ballast 11 to lower the electric energy supplied to ultrahigh-pressure mercury lamp 1. The brightness of ultrahigh-pressure mercury lamp 1 is lowered as the electric energy supplied thereto is lowered, thus reducing the temperature of liquid crystal panels 6. The temperature of liquid crystal panels 6 is thus brought into an allowable temperature range according to the above feedback control process.

If cooling fan 15 suffers trouble and is unable to keep a desired rotational speed, then main control circuit 19 controls fan voltage control circuit 20 to increase the voltage applied to cooling fan 15. Thereafter, since main control circuit 19 judges that the voltage presently applied to cooling fan 15 has reached an upper limit, main control circuit 19 controls lamp output control circuit 18 in ballast 11 to lower the electric energy supplied to ultrahigh-pressure mercury lamp 1. As a result, the electric energy supplied to ultrahigh-pressure mercury lamp 1 is lowered stepwise, reducing the temperature of liquid crystal panels 6.

Advantages offered by the projector according to the second embodiment will be described below with reference to FIG. 5.

Figure 5:
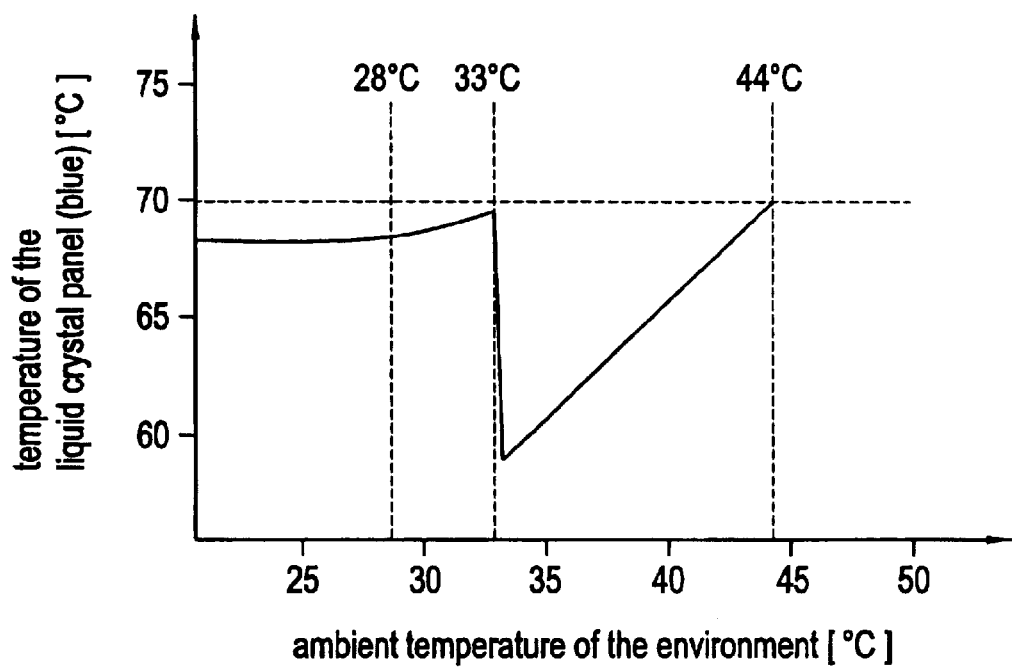
FIG. 5 is a graph showing the temperature of a liquid crystal panel (blue) as it varies when the ambient temperature of an environment where the projector according to the second embodiment is installed is gradually increased.

FIG. 5 is a graph showing the temperature of the liquid crystal panel (blue) as it varies when the ambient temperature of the environment where the projector according to the second embodiment is installed is gradually increased. The horizontal axis of the graph represents the ambient temperature, and the vertical axis thereof represents the temperature of the liquid crystal panel (blue).

Main control circuit 19 controls fan voltage control circuit 20 to increase the voltage applied to cooling fan 15 until the ambient temperature reaches 28° C. The rotational speed of cooling fan 15 is increased to keep the temperature of the liquid crystal panel (blue) at about 68° C.

When the ambient temperature exceeds 33° C., main control circuit 19 judges that the voltage applied to cooling fan 15 has reached an upper limit based on the predetermined relationship between the ambient temperature and the fan voltage, and controls lamp output control circuit 18 to lower the electric energy supplied to ultrahigh-pressure mercury lamp 1.

The electric energy supplied to ultrahigh-pressure mercury lamp 1 is now lowered to lower the brightness thereof and lower the temperature of the liquid crystal panel (blue), increasing the margin up to the allowable temperature to about 10° C. When the ambient temperature is increased, the temperature of liquid crystal panels 6 starts rising. Liquid crystal panels 6 reach the allowable temperature when the ambient temperature is 44° C.

The cooling structure for the projector according to the second embodiment and the method of controlling the cooling structure make it possible to increase the upper limit of the ambient temperature from 33° C. to 44° C. without the need for making the cooling fan large in size and high in rotational speed. Since the electric energy supplied to ultrahigh-pressure mercury lamp 1 is changed depending on the detected temperature, the reliability of optical components having allowable temperatures, typified by the liquid crystal panels, is greatly increased, and those optical components can be installed in places where the ambient temperature is largely variable. Consequently, the projector can be used in a wider range of applications.

3rd Embodiment

Figure 6:
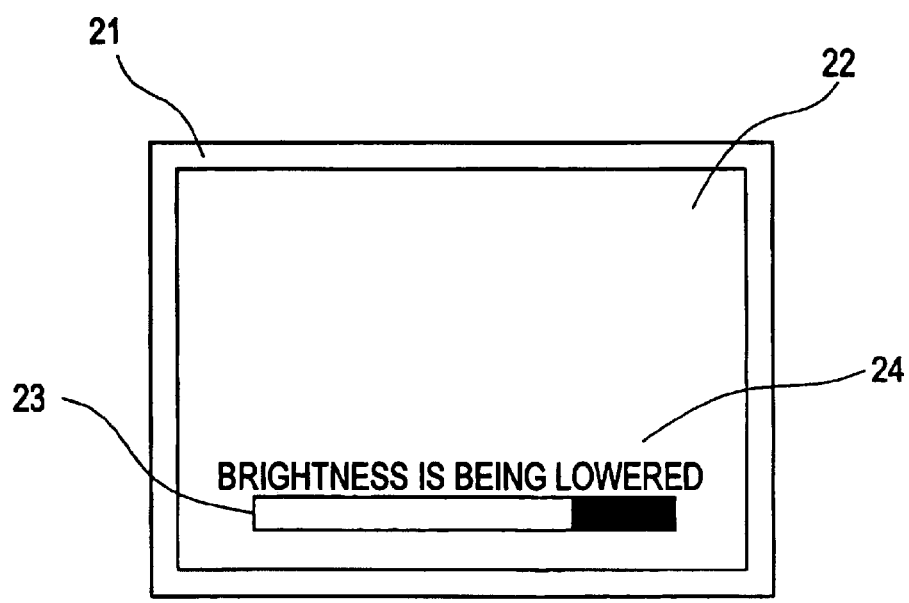
FIG. 6 is a view showing a characteristic portion of a liquid crystal projector according to a second embodiment of the present invention.

An additional function that is applicable to the liquid crystal projectors according to the first and second embodiments will be described below. FIG. 6 shows a characteristic portion of a liquid crystal projector according to a second embodiment of the present invention. In FIG. 6, image 22 is projected onto screen 22 by projection lens 16 of the liquid crystal projectors shown in FIGS. 1 and 3.

In the third embodiment, image 22 projected onto screen 22 includes comment (sentence) 24 stating brightness changes and display bar 23 for displaying patterns that visually indicate brightness changes to the observer of image 22. One example of comment 24 is "BRIGHTNESS IS BEING LOWERED", indicating to the observer that the projector is automatically adjusting its brightness.

Figure 7:
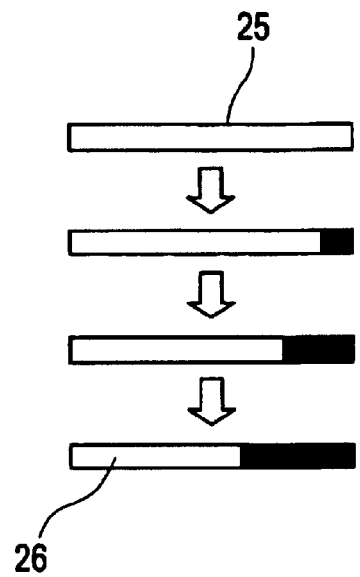
FIG. 7 is a view showing a pattern of brightness changes displayed by a display bar which is added to an image that is projected by the liquid crystal projectors shown in FIGS. 1 and 3.
Figure 8:
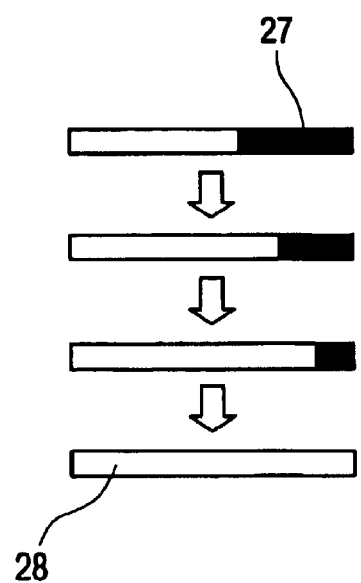
FIG. 8 is a view showing another pattern of brightness changes displayed by a display bar which is added to an image that is projected by the liquid crystal projectors shown in FIGS. 1 and 3.

FIG. 7 shows in detail a pattern of brightness changes displayed by display bar 23, which successively shift from bright level 25 to dark level 26. FIG. 8 shows in detail a pattern of brightness changes displayed by display bar 23, which successively shift from dark level 27 to bright level 28. Since brightness changes are visually displayed by display bar 23, the observer can easily and clearly recognize those brightness changes.

When the electric energy supplied to the light source is changed based on the detected temperature information, if such a change in the electric energy or a change in the brightness of the projected image is displayed in the projected image, then the observer of the image can be aware of the fact that the brightness is adjusted. The observer can thus know that the temperature of the environment where the projector is installed is high, and that environment is not suitable for the installation of the projector, and at the same time know that the brightness of the projected image is automatically changed by the projector.

While preferred embodiments of the present invention have been described using specific terms, such description is for illustrative purposes only, and it is to be understood that changes and variations may be made without departing from the spirit or scope of the following claims.

What is claimed is:

1. A projector comprising:
   a light source for emitting light based on electric energy supplied thereto;
   an optical engine for generating an image with an electronic device energizable based on a video signal and optical means;
   a projection lens for enlarging and projecting the image generated by said light source onto a screen;
   an electric circuit for energizing said electronic device based on a video signal input thereto;
   a power supply for supplying electric energy to said electric circuit and said light source;
   a cooling fan for cooling said optical engine;
   temperature detecting means for detecting a temperature of components of said optical engine and an ambient air temperature; and
   light source electric energy changing means for selecting one of a plurality of non-zero electric energy levels supplied to said light source based on temperature information detected by said temperature detecting means.

2. A projector comprising:
   a light source for emitting light based on electric energy supplied thereto;
   an optical engine for generating an image with an electronic device energizable based on a video signal and optical means;
   a projection lens for enlarging and projecting the image generated by said light source onto a screen;
   an electric circuit for energizing said electronic device based on a video signal input thereto;
   a power supply for supplying electric energy to said electric circuit and said light source;
   a cooling fan for cooling said optical engine;
   temperature detecting means for detecting a temperature of components of said optical engine and an ambient air temperature;
   fan voltage changing means for controlling a voltage applied to said cooling fan based on temperature information detected by said temperature detecting means; and
   light source electric energy changing means for selecting one of a plurality of electric energy levels supplied to said light source if the voltage applied to said cooling fan is determined as having reached an upper limit.

3. A projector according to claim 1, further comprising:
   means for displaying, in the projected image, a comment or visual pattern representing a change in the electric energy level supplied to said light source or brightness changes of the projected image, when said light source electric energy changing means has changed the electric energy level supplied to said light source based on the temperature information detected by said temperature detecting means.

4. A projector according to claim 2, further comprising:
   means for displaying, in the projected image, a comment or a visual pattern representing a change in the electric energy level supplied to said light source or brightness changes of the projected image, when said light source electric energy changing means has changed the electric energy level supplied to said light source based on the temperature information detected by said temperature detecting means.

5. A projector according to claim 1, wherein said temperature detecting means is positioned near a component of said optical engine.

6. A projector according to claim 2, wherein said temperature detecting means is positioned near a component of said optical engine.

7. A projector comprising:
   a light source for emitting light based on electric energy supplied thereto;
   an optical engine for generating an image with an electronic device energizable based on a video signal and optical means;
   a projection lens for enlarging and projecting the image generated by said light source onto a screen;

an electric circuit for energizing said electronic device based on a video signal input thereto;

a power supply for supplying electric energy to said electric circuit and said light source;

a cooling fan for cooling said optical engine;

temperature detecting means for detecting a temperature of components of said optical engine and an ambient air temperature; and light source electric energy changing means for gradually raising or gradually lowering the electric energy level supplied to said light source based on temperature information detected by said temperature detecting means.

8. A projector comprising:

a light source for emitting light based on electric energy supplied thereto;

an optical engine for generating an image with an electronic device energizable based on a video signal and optical means;

a projection lens for enlarging and projecting the image generated by said light source onto a screen;

an electric circuit for energizing said electronic device based on a video signal input thereto;

a power supply for supplying electric energy to said electric circuit and said light source;

a cooling fan for cooling said optical engine;

temperature detecting means for detecting a temperature of components of said optical engine and an ambient air temperature;

fan voltage changing means for controlling a voltage applied to said cooling fan based on temperature information detected by said temperature detecting means; and light source electric energy changing means for gradually lowering the electric energy level supplied to said light source supplied to said light source if the voltage applied to said cooling fan is determined as having reached an upper limit.

* * * * *